(12) United States Patent
Sakurai

(10) Patent No.: US 6,448,821 B1
(45) Date of Patent: Sep. 10, 2002

(54) COMPARATOR CIRCUIT FOR COMPARING DIFFERENTIAL INPUT SIGNAL WITH REFERENCE SIGNAL AND METHOD

(75) Inventor: Satoshi Sakurai, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/560,998

(22) Filed: Apr. 28, 2000

Related U.S. Application Data

(60) Provisional application No. 60/185,077, filed on Feb. 25, 2000.

(51) Int. Cl.[7] .............................................. G01R 19/00
(52) U.S. Cl. .............................. 327/56; 327/66; 327/89
(58) Field of Search ............................. 327/77, 50, 52, 327/53, 56, 63, 65, 66, 82, 89, 93, 96, 97

(56) References Cited

U.S. PATENT DOCUMENTS

| | | | | |
|---|---|---|---|---|
| 4,511,810 A | * | 4/1985 | Yukawa | 327/63 |
| 4,754,169 A | * | 6/1988 | Morris | 327/307 |
| 4,806,791 A | * | 2/1989 | Mizuide | 327/66 |
| 5,142,244 A | * | 8/1992 | Glica et al. | 330/253 |
| 5,287,070 A | * | 2/1994 | Thelen et al. | 330/253 |
| 5,362,995 A | * | 11/1994 | Kubo | 327/65 |
| 5,363,059 A | * | 11/1994 | Thiel | 330/253 |
| 5,606,272 A | * | 2/1997 | Behbahani et al. | 327/65 |
| 5,856,749 A | * | 1/1999 | Wu | 327/66 |
| 5,898,323 A | * | 4/1999 | Suda | 327/66 |
| 5,914,630 A | * | 6/1999 | Peterson | 327/513 |
| 6,034,551 A | * | 3/2000 | Bridgewater, Jr. | 326/82 |

* cited by examiner

*Primary Examiner*—Timothy P. Callahan
*Assistant Examiner*—Hai L. Nguyen
(74) *Attorney, Agent, or Firm*—Girard & Equitz LLP

(57) ABSTRACT

A comparator circuit for comparing a differential input signal to a reference signal. A differential MOS transistor pair is provided having respective gates for receiving the positive and negative components of the differential input signal. A tail current source is coupled to the common sources of the transistor pair, with the current magnitude being related to the reference signal magnitude. The first and second transistors are made differently, typically by making the sizes different, so that the gate-source voltages differ when the transistor currents are equal. A comparator stage provides a digital output which changes state when the transistor currents are equal, with the difference in gate-source voltage representing the comparator trip voltage, a trip voltage related to the magnitude of the reference signal.

46 Claims, 2 Drawing Sheets

COMPARATOR CIRCUIT FOR COMPARING DIFFERENTIAL INPUT SIGNAL WITH REFERENCE SIGNAL AND METHOD

This application claims the benefit of provisional application 60/185,077 filed on Feb. 25, 2000.

BACKGROUND OF THE INVENTION

1. Field of the Invention

The present invention relates generally to data conversion circuitry and in particular to a continuous time comparator circuit which compares a differential analog input to a reference voltage.

2. Description of Related Art

In many analog circuits, particularly where analog to digital conversion is required, an analog input voltage must be compared to a fixed reference voltage. Moreover, in high speed and high precision circuits, signals which are being processed are kept in differential form. Thus, for example, if a signal Vin is to be processed, the signal is divided into what is referred to in the present application as a positive (or first) component (Vinp) and a negative (or second) component (Vinn). Signal Vin is thus represented by the difference between the positive and negative components. In that case, to compare Vin and a reference Vref, it is necessary for the comparison circuitry to compare Vinp and Vinn with Vref. In some applications, Vref is also in differential form and includes a positive component Vrefp and a negative component Vrefn. In that event, the comparator circuitry must compare the difference between Vinp and Vinn with the difference between Vrefn and Vrefp. The same result can be achieved by comparing the difference of Vrefn and Vinn with the difference of Vrefp and Vinp. Also, the same result can be achieved by summing Vinn and Vrefp and summing Vinp and Vrefn and comparing the two sums.

Referring to the drawings, FIG. 1 is circuit diagram of a prior art comparator circuit for comparing a differential input Vin with a differential reference voltage Vref. Two differential transistor pair are used, including a first pair made up of transistors 10A and 10B and a second pair made up of transistors 12A and 12B. The two pair share a load with includes resistors R1 and R2. The voltage drop across resistor R1 is compared to the voltage drop across resistor R2 by a comparator stage 18 which provides a digital output which is high, near voltage VDD, when input voltage Vin is greater than reference Vref, and which is low, near VSS, when the input voltage is less than Vref.

The voltage drop across resistor R1 is the sum of currents I1 and I3 and the voltage drop across resistor R2 is the sum of the currents I2 and I4. Thus, the voltage drop across R1 is related to the sum of Vinp and Vrefn and the voltage drop across R2 is related to the sum of Vinn and Vrefp. As noted above, by comparing these two sums, the relative magnitudes of Vin and Vref can be ascertained. This operation is carried out by comparator stage 18 where output Vo is indicative of the relative magnitudes.

The two differential stages of the FIG. 1 comparator circuit operate to convert input voltages to currents, a conversion which is non-linear in nature. In addition, the addition of the currents are non-linear. Thus, the common mode voltage of Vref, the average of Vrefp and Vrefn, must be equal to the common mode voltage of Vin, the average of Vinp and Vinn or the FIG. 1 circuit will not operate properly. In many instances, however, the Vin is the output of a previous stage where the differential voltage of Vin is very accurate, but the common mode voltage accuracy is significantly more relaxed. In such cases, the common mode voltage of Vin can be a few hundred millivolts away from the nominal value thereby severely degrading the accuracy of the comparator circuit.

FIGS. 2A and 2B show another type of comparator circuit which only utilizes a single differential pair made up of transistors 20A and 20B. A pair of input capacitors C1 and C2, together with the inputs of the differential pair, are connected to a transistor switch array (not depicted). The comparator circuit switches between an initialize state and a compare state. Thus, the FIGS. 2A/2B circuit differs in this respect from the continuous-time comparator circuit of FIG. 1.

In the initialize state, shown in FIG. 2A, the switch array causes first terminals of capacitors C1 and C2 to be connected to Vrefp and Vrefn, respectively and the second terminals to be connected to ground. Thus, a voltage related to Vrefp and Vrefn is placed on capacitors C1 and C2, respectively. In addition, the inputs of differential pair 20A/20B are grounded.

In the compare state, shown in FIG. 2B, all of the closed transistor switches are opened. Soon thereafter, the switch array causes the first terminals of capacitors to be connected to Vinp and Vinn, respectively, and the second terminals to be connected to the respective inputs of the differential stage. The voltage applied to the gate of differential transistor 20A will thus be related to the difference between Vrefp and Vinp and the voltage applied to the gate of transistor 20B will thus be related to the difference between Vrefn and Vinn. The differential stage will amplify the difference between the two values stored on capacitors C1 and C2. The amplified difference is forwarded to a comparator stage 24 which produces a value Vo related to the relative magnitudes of Vref and Vin.

Although the FIGS. 2A/2B comparator circuit is free from the common mode voltage dependency of the FIG. 1 circuit, the FIGS. 2A/2B circuit possesses a serious drawback other than not being continuously operable. The Vinp and Vinn terminals are disturbed every time the capacitors C1 and C2 are connected to and disconnected from the terminals because the terminals must provide the current used to charge and discharge the capacitors. If Vin is being processed by other circuits, inaccurate results may be obtained since Vin has been affected by the switched capacitor circuit. The same degradation can occur on the Vref terminals as they also have to supply charge and discharge currents. Perhaps more importantly, a charge created by the switching signals for the switch array (not depicted) will tend to feed through by way of the switch capacitances thereby disturbing both Vin and Vref.

The present invention overcomes many of the shortcomings of the prior art comparator circuits previously described. A continuous-time comparator circuit is disclosed having a single differential stage and which is not subject to the common mode requirements associated with certain prior art comparator circuits noted above. These are other advantages of the present invention will become apparent to those skilled in the art upon a reading of the following Detailed Description of the Invention together with the drawings.

SUMMARY OF THE INVENTION

A comparator circuit and related method are disclosed for comparing a differential input signal with a reference signal. The comparator circuit includes first and second MOS transistors connected as a differential pair and having gates connected to receive first and second components, respectively, of the differential input signal. The first and second transistors have respective transistors constants, K1 and K2, that differ. Typically, the ratio of K2/K1 is at least 1.1 and preferably closer to 2–3.

A tail current source is connected to the sources of the first and second MOS transistors, with the current source output current being related to the reference signal. Preferably, the current output is related to the square of the reference signal. A comparator stage is included that is configured to provide a digital output indicative of the relative magnitude of the reference signal and differential input signal. The comparator stage preferably compares the relative magnitude of the drain-source currents of the first and second MOS transistors.

DETAILED DESCRIPTION OF THE INVENTION

Figure 1:
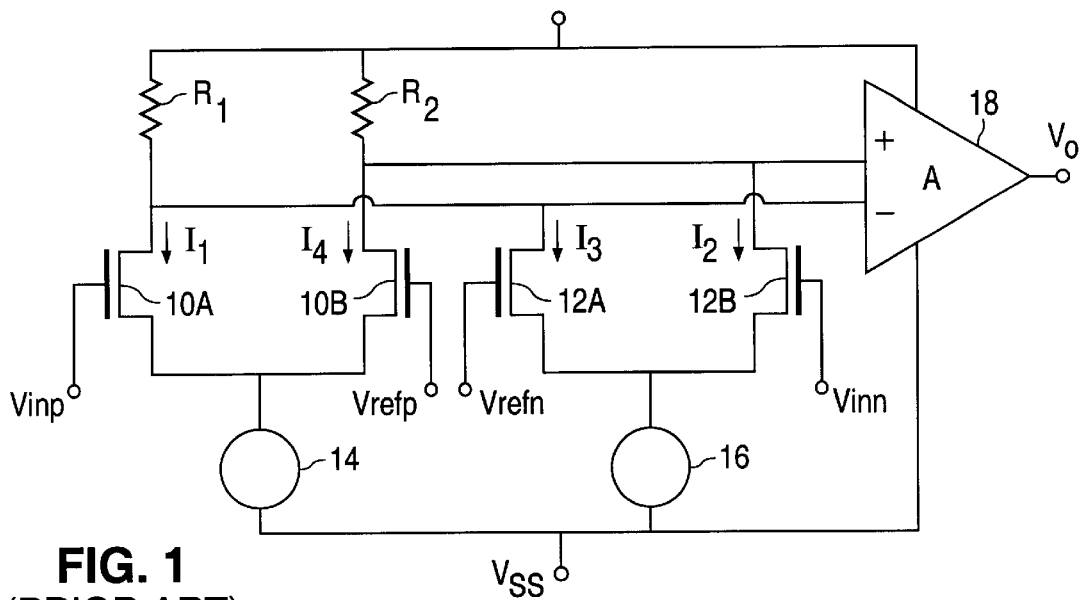
FIG. 1 is a schematic diagram of a conventional dual differential stage comparator circuit.
Figure 2A:
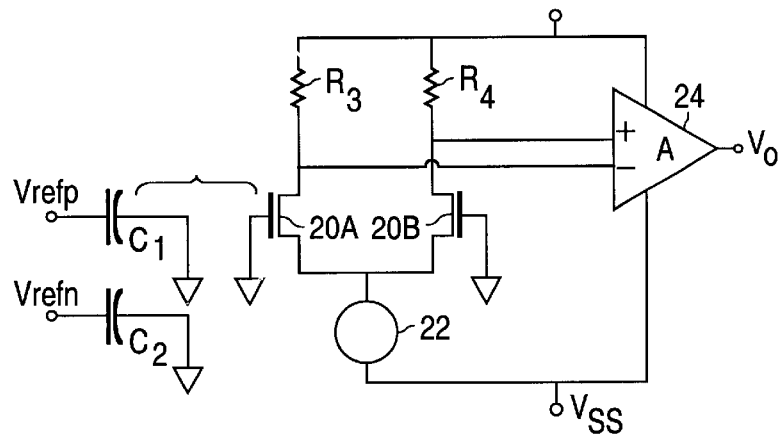
FIGS. 2A and 2B are diagrams illustrating the construction and operation of a conventional switched capacitor comparator circuit.
Figure 2B:
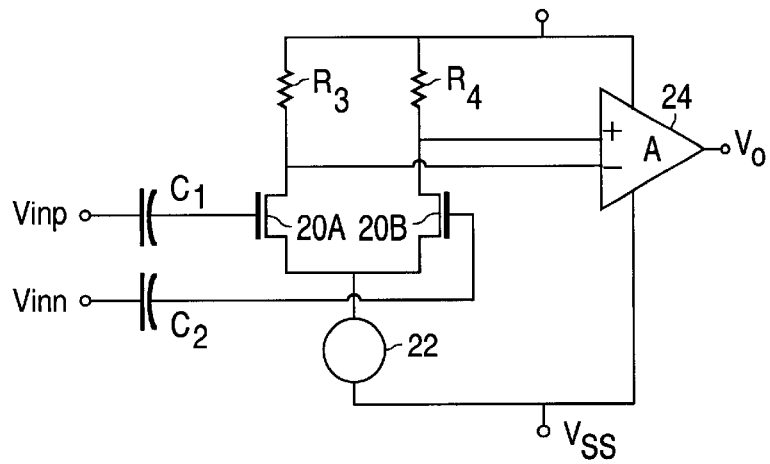
Figure 3:
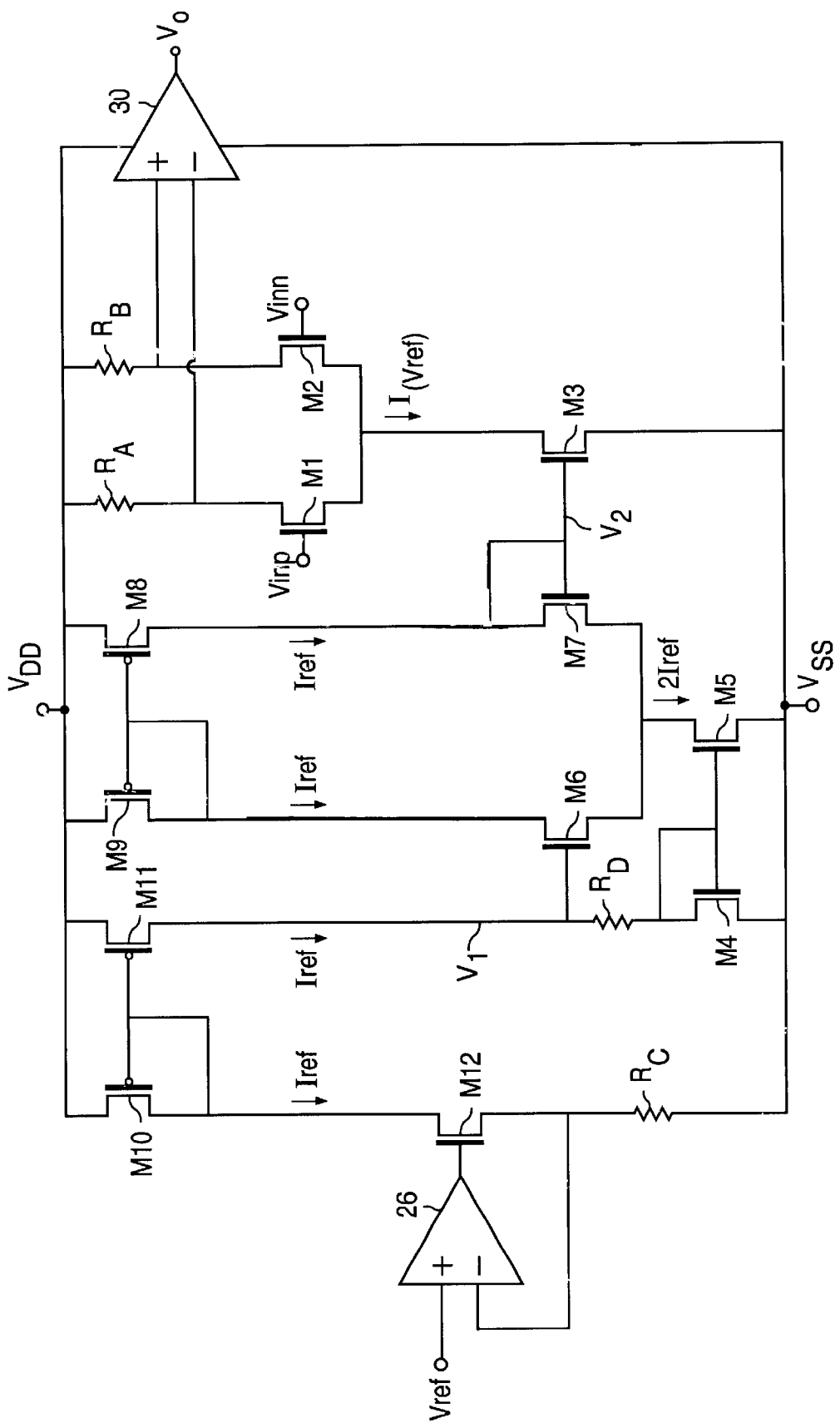
FIG. 3 is a circuit diagram of one embodiment of a comparator circuit in accordance with the present invention.

Referring again to the drawings, FIG. 3 is a schematic diagram of one embodiment of a comparator circuit in accordance with the present invention. In this embodiment, a differential input signal Vin, having a positive component Vinp and a negative component Vinn, is compared to a single ended reference voltage Vref or a fraction of Vref. The comparator circuit includes a differential stage made up of differential transistor pair M1 and M2.

As will be explained in greater detail, transistors M1 and M2 are sized differently so that when the current flow through the transistors is equal, the gate voltages of the transistors differ by a controlled voltage, referred to as the trip voltage Vtrip. The trip voltage Vtrip is made a function of the device size of transistors M1 and M2 (or other transistor variable) and the bias current I(Vref).

I(Vref), with the designation indicating that the current is a function of Vref, is produced by the tail current source made up of transistor M3. When the currents through M1 and M2 become equal, the voltage drops across load resistors RA and RB become equal, assuming that the resistors are equal, so that a comparator stage 30 output Vo will change state. The trip voltage Vtrip is made to be a linear function of Vref so that comparator output Vo is indicative of the relative magnitude of inputs Vinp and Vinn and Vref or some fraction of Vref.

The drain-source current IDS of a transistor operating in the saturation region can be expressed as follows:

$$IDS = K(Vgs - Vt)^2 \quad (1)$$

where K is a transistor constant defined in equation (2) below, Vgs is the gate-source voltage and Vt is the transistor threshold voltage.

The transistor constant K is as follows:

$$K = (\mu_s \, Cox \, Z)/2L \quad (2)$$

where $\mu_s$ is the surface mobility of the majority carriers in the induced channel, Cox is the capacitance per unit area of the gate electrode, Z is the channel width and L is the channel length.

The trip point Vtrip of the FIG. 3 comparator circuit is where the transistor current for transistor M1, IDS1, is equal to the transistor current for transistor M2, IDS2. When the two currents are equal, inspection shows that IDS1 and IDS2 will be equal to ½ the tail current source output I(Vref).

Assuming that IDS1 and IDS2 are equal, the trip point Vtrip for the comparator circuit is as follows:

$$Vtrip = Vgs1 - Vgs2 \quad (3)$$

Solving equation (1) for Vgs and assuming that IDS1 and IDS2 are both equal to I(Vref)/2, equation (3) can be rewritten as follows:

$$Vtrip = \sqrt{\frac{I(Vref)}{2K1}} - \sqrt{\frac{I(Vref)}{2K2}} \quad (4)$$

where K1 and K2 are the constants for transistors M1 and M2, respectively.

It can be seen from equation (4) that if transistors M1 and M2 are matched (K1=K2), the trip point is zero, with the trip point increasing for greater differences. Referring to equation (2), the preferred manner to making K1 and K2 differ is to make the channel widths Z different. This can be done, by way of example, by connecting two standard transistors in parallel thereby doubling the channel width Z.

Equation (4) can be rewritten as follows:

$$Vtrip = \sqrt{b} \sqrt{\frac{I(Vref)}{2K1}} \quad (5)$$

where b is defined in equation (6) below.

The value of b is as follows:

$$\sqrt{b} = 1 - \frac{1}{\sqrt{a}} \quad (6)$$

where the value of a is defined in equation (7).

$$a = \frac{K2}{K1} \quad (7)$$

From equation (5) it can be seen for a given difference in K1 and K2, the trip point Vtrip can be made a function of the bias current I(Vref) and thus the reference voltage Vref as follows:

$$I(Vref) = \frac{2K1}{b}(Vtrip)^2 \quad (8)$$

As indicated by equation (8), the trip point Vtrip can be set to Vref or fraction of Vref by controlling the values of K1 and K2 and by producing an appropriate bias voltage I(Vref). The manner in which I(Vref) is produced will now be described.

Referring again to FIG. 3, an amplifier circuit 26 is shown having a non-inverting input connected to a reference voltage source Vref. The output of amplifier 26 is connected to a gate of transistor M12, with the source of M12 connected to the inverting input of amplifier 26. Negative feedback of amplifier 26 forces the source voltage of transistor M12 to be equal to Vref. Thus, the current flow through resistor RC connected in series with transistor M12, current Iref, is as follows:

$$Iref = \frac{Vref}{RC} \quad (9)$$

Note that VSS is assumed to be at ground potential in order to simplify the analysis, but VSS can be at some voltage other than ground. Transistor M10, which forms the input half of a current mirror, conducts current Iref so that matching transistor M11 which forms the output half of the current mirror also conducts current Iref. A second current mirror includes an input transistor M4 connected in series with transistor M11. Thus, transistor M11 conducts Iref as does resistor RD connected in series between transistors M4 and M11.

Transistors M6 and M7 form a differential pair and, as will be explained, operate as a voltage level shifting circuit. Transistor M5, the output half of the current mirror made up of transistors M4 and M5, has twice the channel width of transistor M4 and thus conducts twice the current, namely, 2Iref. Load transistors M8 and M9 form a current mirror so that the tail current source is split evenly between transistors M6 and M7.

The gate of transistor M7 is connected directly back to what can be considered the output of the differential stage located between transistors M7 and M8. Because of this feedback connection, the voltage gain of the stage is unity. However, as will be explained, transistors M6 and M7 are sized differently so that the input of the stage at the gate of transistor M6, voltage V1, is not equal to the output voltage V2 at the gate of transistor M7. The output of the level shifting circuit, voltage V2, is connected to the gate of tail current source transistor M3. The relationship between voltage Vref and I(Vref) will now be explained, as will the relationship between the comparator circuit trip voltage Vtrip and Vref.

Equation (9) and inspection of the FIG. 3 circuit shows that voltage V1 is as follows:

$$V1 = \frac{RD}{RC}(Vref) + Vgs4 \quad (10)$$

where Vgs4 is the gate-source voltage of transistor M4.

Inspection of the FIG. 3 circuit also shows that the voltage V2 is as follows:

$$V2 = V1 + Vgs7 - Vgs6 \quad (11)$$

where Vgs7 and Vgs6 are the gate-source voltages for transistors M7 and M6, respectively.

The value of I(Vref) can also be determined based upon equation (1) where the gate-source voltage of transistor M3 is V2, as follows:

$$I(Vref) = K3(V2-Vt)^2 \quad (12)$$

where K3 and Vt are the transistor constant and threshold voltage for transistor M3, respectively.

By combining equations (10) and (11) and substituting the result into equation (12), equation (12) can be rewritten as follows:

$$I(Vref) = K3\left(\frac{RD}{RC}(Vref) + Vgs4 + Vgs7 - Vgs6 - Vt\right)^2 \quad (13)$$

Solving equation (1) for the various gate-source voltages and substituting the results into equation (13) results in the following:

$$I(Vref) = K3\left(\frac{RD}{RC}(Vref) + \sqrt{Iref}\left(\sqrt{\frac{1}{K4}} + \sqrt{\frac{1}{K7}} - \sqrt{\frac{1}{K6}}\right)\right)^2 \quad (14)$$

Equation (14) can be simplified by adjusting the transistor constant values K as follows:

$$\sqrt{\frac{1}{K4}} + \sqrt{\frac{1}{K7}} = \sqrt{\frac{1}{K6}} \quad (15)$$

Using equation (15), equation (14) can be reduced further as follows:

$$I(Vref) = K3\left(\frac{RD}{RC}Vref\right)^2 \quad (16)$$

It can be seen by comparing equations (16) and (8) that equation (16) can be placed in the same form as equation (8) be setting K3 to the following:

$$K3 = \frac{2K1}{b} \quad (17)$$

Substituting the new value of K3 according to equation (17), equation (16) can be rewritten as follows:

$$I(Vref) = 2\frac{K1}{b}\left(\frac{RD}{RC}Vref\right)^2 \quad (18)$$

Examination of equations (18) and (8) shows that Vtrip is as follows:

$$Vtrip = \frac{RD}{RC}(Vref) \quad (19)$$

Thus, the trip point Vtrip can be adjusted by changing the magnitude of the reference voltage Vref and, further, can be made any fraction of the selected value of Vref by changing the resistor ratio of RD and RC.

As can be seen by equations (17) and (6), the transistor constant K3 of transistor M3 is a function of the ratio of the transistor constants for transistor M2 and M1, that is, K2/K1. This ratio, as indicated by equation (2), is typically set by altering the ratio of the channel width Z of transistor M2 to the channel width Z of transistor M1. In order to maintain a reasonable value for K3, which is usually determined by the channel width Z of transistor M3, the ratio should be at least 1.1, and preferably 2 or more.

Thus, a novel comparator circuit has been disclosed. Although one embodiment has been described in some detail, it is to be understood that certain changed can be made by those skilled in the art without departing from the spirit and scope of the invention as defined by the appended claims.

What is claimed is:

1. A method of comparing a differential input signal with a reference signal, said method comprising:
   providing first and second MOS transistors, with the second MOS transistor having a transistor constant K2 at least 1.1 times a transistor constant K1 of the first MOS transistor;
   applying a first component of the differential input signal to a gate of the first MOS transistor;
   applying a second component of the differential input signal to a gate of the second MOS transistor;
   producing a control current having a magnitude which is related to an approximate square of the reference signal;
   applying the control current to sources of the first and second MOS transistors; and
   producing a digital compare output based upon relative magnitudes of a drain-source current of the first and second MOS transistors.

2. The method of claim 1 wherein the control current is approximately proportional to the square of a magnitude of the reference signal.

3. The method of claim 1 wherein the producing a control current includes providing a third MOS transistor having a drain coupled to the sources of the first and second MOS transistors and applying a first gate-source voltage to third MOS transistor related to the reference signal.

4. The method of claim 3 wherein the first gate-source voltage includes a first component related to the reference signal and a second component related an algebraic sum of gate-source voltages of three MOS transistors.

5. The method of claim 3 wherein the applying a first gate-source voltage includes providing fourth, fifth and sixth MOS transistors, producing a related first voltage related to the reference signal, producing a second gate-source voltage from the fourth transistor, producing a third gate-source voltage from the fifth transistor and producing a fourth gate-source voltage from the sixth transistor and combining the related first voltage, the second, third and fourth gate-source voltages to produce the first gate-source voltage.

6. The method of claim 5 wherein the combining includes subtracting the fourth gate-source voltage from a sum of the related first voltage, the second gate-source voltage and the third gate-source voltage.

7. The method of claim 6 wherein the producing a second gate-source voltage includes passing a first reference current through the fourth MOS transistor, the producing a third gate-source voltage includes passing a second reference current through the fifth MOS transistor and the producing fourth gate-source voltage includes passing a third reference current through the sixth MOS transistor.

8. The method of claim 7 wherein the first, second and third reference currents are approximately a same magnitude.

9. The method of claim 8 wherein transistor constants of the fourth, fifth and sixth transistors are approximately in accordance with the equation $(1/K4)^{1/2}+(1/K5)^{1/2}=(1/K6)^{1/2}$ where K4, K5 and K6 are the transistor constants of the fourth, fifth and sixth MOS transistors, respectively.

10. The method of claim 1 wherein the producing a control current includes providing a third MOS transistor having a drain coupled to the sources of the first and second MOS transistors, with the third MOS transistor having a transistor constant K3 which is at least twice the transistor constant K1 of the first MOS transistor.

11. The method of claim 10 wherein the transistor constant K3 of the third MOS transistor is a function of the transistor constants K1 and K2 of the first and second MOS transistors, respectively.

12. The method of claim 11 wherein the transistor constant K3 of the third MOS transistor is approximately equal to $2K1/(1-1/(K2/K1)^{1/2})^2$.

13. The method of claim 1 wherein the transistor constant K2 is at least twice the transistor constant K1.

14. The method of claim 13 wherein the producing a digital compare output includes comparing voltages at drains of the first and second MOS transistors.

15. A comparator circuit for comparing a differential input signal having first and second components with a reference signal, said comparator circuit comprising:
   a first MOS transistor having an associated transistor constant K1, with a gate of the first transistor being connected to receive the first component of the differential input signal;
   a second MOS transistor having an associated transistor constant K2 which is larger than the first transistor constant K1, with a gate of the second transistor being connected to receive the second component of the differential input signal;
   a tail current source having an output coupled to a source of the first and second MOS transistors and a current output which is related to an approximate square of the reference signal; and
   a comparator section configured to provide a digital output indicative of relative magnitudes of drain-source current of the first and second MOS transistors.

16. The comparator circuit of claim 15 wherein the tail current source includes a third MOS transistor having an associated transistor constant K3 is related in value to constants K1 and K2.

17. The comparator circuit of claim 16 wherein transistor constant K3 is approximately equal to $2K1/(1-1/(K2/K1)^{1/2})^2$.

18. The comparator circuit of claim 16 further including biasing circuitry configured to produce a first bias voltage, related to the reference signal, which is applied to a gate of the third MOS transistor.

19. The comparator circuit of claim 18 wherein the biasing circuitry includes a first voltage related to the reference signal and which is connected in series with a gate-source voltage of a fourth MOS transistor.

20. The comparator circuit of claim 19 wherein the biasing circuitry includes a first resistor which conducts a first reference current so that the first voltage is developed across the first resistor.

21. The comparator circuit of claim 20 wherein the biasing circuitry includes a second resistor which conducts a second reference current and wherein the biasing circuitry further includes a current mirror circuit having an input that receives the second reference current and an output which produces the first reference current so that the first voltage has a magnitude related to resistance values of the first and second resistors.

22. The comparator circuit of claim 21 wherein the biasing circuitry includes a fifth and a sixth MOS transistor, each of which produce a gate-source voltage connected in series with the gate-source voltage of the fourth MOS transistor.

23. The comparator circuit of claim 22 wherein the fourth MOS transistor conducts the first reference current and the fifth and sixth MOS transistors each conduct a current proportional to the first reference current.

24. The comparator circuit of claim 23 wherein the fifth and sixth MOS transistors are connected as a differential pair having a common source connection.

25. The comparator circuit of claim 15 wherein a ratio of K2/K1 is at least 1.1.

26. A comparator circuit for comparing a differential input signal having first and second components with a reference signal, said comparator circuit comprising:
   a first MOS transistor having an associated transistor constant K1, with a gate of the first transistor being connected to receive the first component of the differential input signal;
   a second MOS transistor having an associated transistor constant K2, with a ratio of K2/K1 being at least 1.1, with a gate of the second transistor being connected to receive the second component of the differential input signal;
   a third MOS transistor having a drain coupled to sources of the first and second MOS transistors;
   a bias circuit configured to apply a first gate-source voltage to the third MOS so as to produce a current in the third MOS transistor which is a function of an approximate square value of the reference signal; and
   a comparator section coupled to respective drains of the first and second MOS transistors and configured to provide a digital output indicative of relative magnitudes of the differential input signal and the reference signal.

27. The comparator circuit of claim 26, wherein the comparator section is configured to provide a digital output indicative of a relative magnitude of drain-source currents of the first and second MOS transistors.

28. The comparator circuit of claim 26 wherein the bias circuit includes fourth, fifth and sixth MOS transistors and a reference voltage source based upon the reference signal and combining circuitry for combining the reference voltage source, and second, third and fourth gate-source voltages of the fourth, fifth and sixth MOS transistors, respectively, to produce the first gate source voltage.

29. The comparator circuit of claim 28 wherein the fourth, fifth and sixth MOS transistor are biased to conduct drain-source currents related in magnitude to the reference voltage source.

30. The comparator circuit of claim 29 wherein the reference voltage source includes a first resistor connected between gates of the fourth and fifth MOS transistors.

31. The comparator circuit of claim 30 wherein the first resistor conducts a first reference current and wherein the bias circuit further includes a second resistor which conducts a second reference current related to the reference signal and a current mirror circuit having an input that receives the second reference current and an output that produces the first reference current so that the reference voltage source magnitude is related to the first resistor and the second resistor.

32. A method of comparing a differential input signal with a continuously adjustable reference signal using a comparator circuit powered by a supply voltage, said method comprising:
   producing the continuously adjustable reference signal having a magnitude relatively independent of the supply voltage;
   providing first and second MOS transistors, with the second MOS transistor having a transistor constant K2 at least 1.1 times a transistor constant K1 of the first MOS transistor;
   applying a first component of the differential input signal to a gate of the first MOS transistor;
   applying a second component of the differential input signal to a gate of the second MOS transistor;
   producing a control current having a magnitude which is related to the continuously adjustable reference signal;
   applying the control current to sources of the first and second MOS transistors; and
   producing a digital compare output based upon relative magnitudes of a drain-source current of the first and second MOS transistors.

33. The method of claim 32 wherein the producing a control current includes providing a third MOS transistor having a drain coupled to the sources of the first and second MOS transistors and applying a first gate-source voltage to third MOS transistor related to the continuously adjustable reference signal.

34. The method of claim 33 wherein the first gate-source voltage includes a first component related to the continuously adjustable reference signal and a second component related an algebraic sum of gate-source voltages of three MOS transistors.

35. The method of claim 33 wherein the applying a first gate-source voltage includes providing fourth, fifth and sixth MOS transistors, producing a related first voltage related to the continuously adjustable reference signal, producing a second gate-source voltage from the fourth transistor, producing a third gate-source voltage from the fifth transistor and producing a fourth gate-source voltage from the sixth transistor and combining the related first voltage, the second, third and fourth gate-source voltages to produce the first gate-source voltage.

36. The method of claim 35 wherein the combining includes subtracting the fourth gate-source voltage from a sum of the related first voltage, the second gate-source voltage and the third gate-source voltage.

37. The method of claim 36 wherein the producing a second gate-source voltage includes passing a first reference current through a fourth MOS transistor, the producing a third gate-source voltage includes passing a second reference current through a fifth MOS transistor and the producing fourth gate-source voltage includes passing a third reference current through a sixth MOS transistor.

38. The method of claim 37 wherein the first, second and third reference currents are approximately a same magnitude.

39. The method of claim 38 wherein transistor constants of the fourth, fifth and sixth transistors are approximately in accordance with the equation $(1/K4)^{1/2}+(1/K5)^{1/2}=(1/K6)^{1/2}$ where K4, K5 and K6 are the transistor constants of the fourth, fifth and sixth MOS transistors, respectively.

40. The method of claim 32 wherein the producing a control current includes providing a third MOS transistor having a drain coupled to the sources of the first and second MOS transistors, with the third MOS transistor having a transistor constant K3 which is at least twice the transistor constant K1 of the first MOS transistor.

41. The method of claim 40 wherein the transistor constant K3 of the third MOS transistor is a function of the transistor constants K1 and K2 of the first and second MOS transistors, respectively.

42. The method of claim 41 wherein the transistor constant K3 of the third MOS transistor is approximately equal to $2K1/(1-1/(K2/K1)^{1/2})^2$.

43. The method of claim 32 wherein the transistor constant K2 is at least twice the transistor constant K1.

44. The method of claim 43 wherein the producing a digital compare output includes comparing voltages at drains of the first and second MOS transistors.

45. A comparator circuit for comparing a differential input signal having first and second components with a continu ously adjustable reference signal, said comparator circuit comprising:

means for generating the continuously adjustable reference signal, with the reference signal being substantially independent of variations in a supply voltage for the comparator circuit;

a first MOS transistor having an associated transistor constant K1, with a gate of the first transistor being connected to receive the first component of the differential input signal;

a second MOS transistor having an associated transistor constant K2, with a ratio of K2/K1 being at least 1.1, with a gate of the second transistor being connected to receive the second component of the differential input signal;

a comparator section coupled to respective drains of the first and second MOS transistors and configured to provide a digital output; and a tail current source coupled to sources of the first and second MOS transistors and configured to produce a current related to the continuously adjustable reference signal such that the digital output is related to a difference between the continuously adjustable reference signal and the differential input signal.

46. The comparator circuit of claim 45 wherein the current related to the continuously adjustable reference signal is related to an approximate square of the continuously adjustable reference signal.

* * * * *